United States Patent

Nichols

[11] Patent Number: 5,986,486
[45] Date of Patent: Nov. 16, 1999

[54] CIRCUITS AND METHODS FOR A PHASE LOCK LOOP FOR SYNCHRONOUS REFERENCE CLOCKS

[75] Inventor: Richard Allen Nichols, Richardson, Tex.

[73] Assignee: ADC Telecommunications, Inc., Minnetonka, Minn.

[21] Appl. No.: 08/966,606

[22] Filed: Nov. 10, 1997

[51] Int. Cl.$^6$ ........................................... H03L 7/06
[52] U.S. Cl. ..................... 327/156; 327/147; 327/233; 331/DIG. 2; 375/376
[58] Field of Search ........................... 327/147, 146, 327/244, 145, 144, 243, 233, 236, 9, 156; 331/17, 12, DIG. 2, 11; 375/373–376

[56] References Cited

U.S. PATENT DOCUMENTS

| | | | |
|---|---|---|---|
| 3,792,478 | 2/1974 | Le Parquier et al. | 342/368 |
| 3,869,579 | 3/1975 | Otto | 370/507 |
| 4,563,657 | 1/1986 | Qureshi | 331/25 |
| 4,600,896 | 7/1986 | Cellerino | 331/11 |
| 5,475,325 | 12/1995 | Nezu | 327/147 |
| 5,570,053 | 10/1996 | Takla | 327/292 |
| 5,615,177 | 3/1997 | Yahata | 368/10 |
| 5,719,908 | 2/1998 | Greeff | 375/376 |
| 5,726,607 | 3/1998 | Brede | 331/2 |

FOREIGN PATENT DOCUMENTS 1221258  2/1973  United Kingdom.

Primary Examiner—Kenneth B. Wells
Assistant Examiner—Minh Nguyen
Attorney, Agent, or Firm—Schwegman, Lundberg Woessner and Kluth

[57] ABSTRACT

A phase lock loop circuit. The phase lock loop circuit includes first and second pass gates. The pass gates include signal inputs that receive first and second reference signals, respectively. The pass gates also have enable inputs. The phase lock loop also includes a loop filter that is coupled to the outputs of the first and second pass gates. A loop oscillator is coupled to the output of the loop filter. A strobe circuit is coupled to the output of the loop oscillator. The strobe circuit provides an input signal to the enable inputs of the first and second pass gates so as to sample the first and second reference signals. The loop filter uses the samples of the first and second reference signals to create a control signal that forces the loop oscillator to output a signal with a phase that is between the phases of the first and second reference signals.

23 Claims, 6 Drawing Sheets

CIRCUITS AND METHODS FOR A PHASE LOCK LOOP FOR SYNCHRONOUS REFERENCE CLOCKS

TECHNICAL FIELD OF THE INVENTION

The present invention relates generally to the field of electrical circuits and, in particular, to circuits and methods for a phase lock loop for synchronous reference clocks.

BACKGROUND OF THE INVENTION

Electronic systems typically use a timing signal from a timing source, e.g., a pulse train generated by a clock circuit, to coordinate the interoperation of various electronic circuits within the system. For example, this timing signal is used to coordinate the passing of data through the system and to initiate various procedures that operate on the data. To improve the reliability of such systems, a back-up timing source is typically included. The back-up timing source is used when, for example, the main timing source fails or is removed from the system for maintenance.

Telecommunications systems are being designed to operate at increasingly higher speeds. Unfortunately, in conventional telecommunications systems, data is often lost when the system switches between the primary timing source and the back-up timing source. This is referred to in the industry as a "hit" during the switch. The hit is caused by phase differences between the primary and back-up timing sources. As the system speeds increase, the amount of data lost during a switch over to the back-up timing source can cause unacceptable levels of lost data that need to be retransmitted.

For the reasons stated above, and for other reasons stated below which will become apparent to those skilled in the art upon reading and understanding the present specification, there is a need in the art for a system that can switch between primary and back-up timing sources without an unacceptable hit on the data transmitted by the system.

SUMMARY OF THE INVENTION

The above mentioned problems with telecommunications systems and other problems are addressed by the present invention and which will be understood by reading and studying the following specification. A circuit and method for a phase lock loop is described which locks a loop oscillator at a phase that is between the phase of two reference timing sources such that when one of the reference timing sources is removed or fails, the system requires approximately half the phase adjustment as compared to conventional systems.

In particular, an illustrative embodiment of the present invention includes a phase lock loop circuit. The phase lock loop circuit includes first and second pass gates. The pass gates include signal inputs that receive first and second reference signals, respectively. The pass gates also have enable inputs. The phase lock loop also includes a loop filter that is coupled to the outputs of the first and second pass gates. A loop oscillator is coupled to the output of the loop filter. A strobe circuit is coupled to the output of the loop oscillator. The strobe circuit provides an input signal to the enable inputs of the first and second pass gates so as to sample the first and second reference signals. The loop filter uses the samples of the first and second reference signals to create a control signal that forces the loop oscillator to output a signal with a phase that is between the phases of the first and second reference signals.

In another embodiment, an apparatus is provided. The apparatus includes a functional circuit, e.g., an add/drop multiplexer or a clocked data source for an optical transmitter. The apparatus includes first and second inputs that receive timing signals from first and second timing sources. Further, a phase lock loop is provided that uses a single strobe circuit to sample the timing signals from the first and second timing sources. The phase lock loop creates a control signal from the samples of the first and second timing sources to establish a phase error input signal for a loop oscillator. The loop oscillator produces an output signal with a phase that is between the phase of the timing signals for the first and second sources. The output signal is provided as a timing signal to the functional circuit.

In another embodiment, an apparatus is provided. The apparatus includes first and second timing sources that produce first and second timing signals. Further, a functional circuit is provided. The apparatus also includes first and second inputs that receive the first and second timing signals. A phase lock loop uses a single strobe circuit to sample the first and second timing signals. The phase lock loop further uses a loop filter to create a control signal from the sampled first and second timing signals to establish a phase error input signal for a loop oscillator. The loop oscillator produces an output signal with a phase that is between the phase of the first and second timing signals. The output signal is provided as a timing signal to the functional circuit.

In another embodiment, a method for establishing a timing signal for a functional circuit from first and second reference signals is provided. According to the method, a strobe circuit is driven with the output of a loop oscillator. The first and second reference signals are sampled using the output of the strobe. Further, a control signal for the loop oscillator is generated based on the sampled first and second reference signals so as to place the phase of the loop oscillator between the phase of the first and second reference signals.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
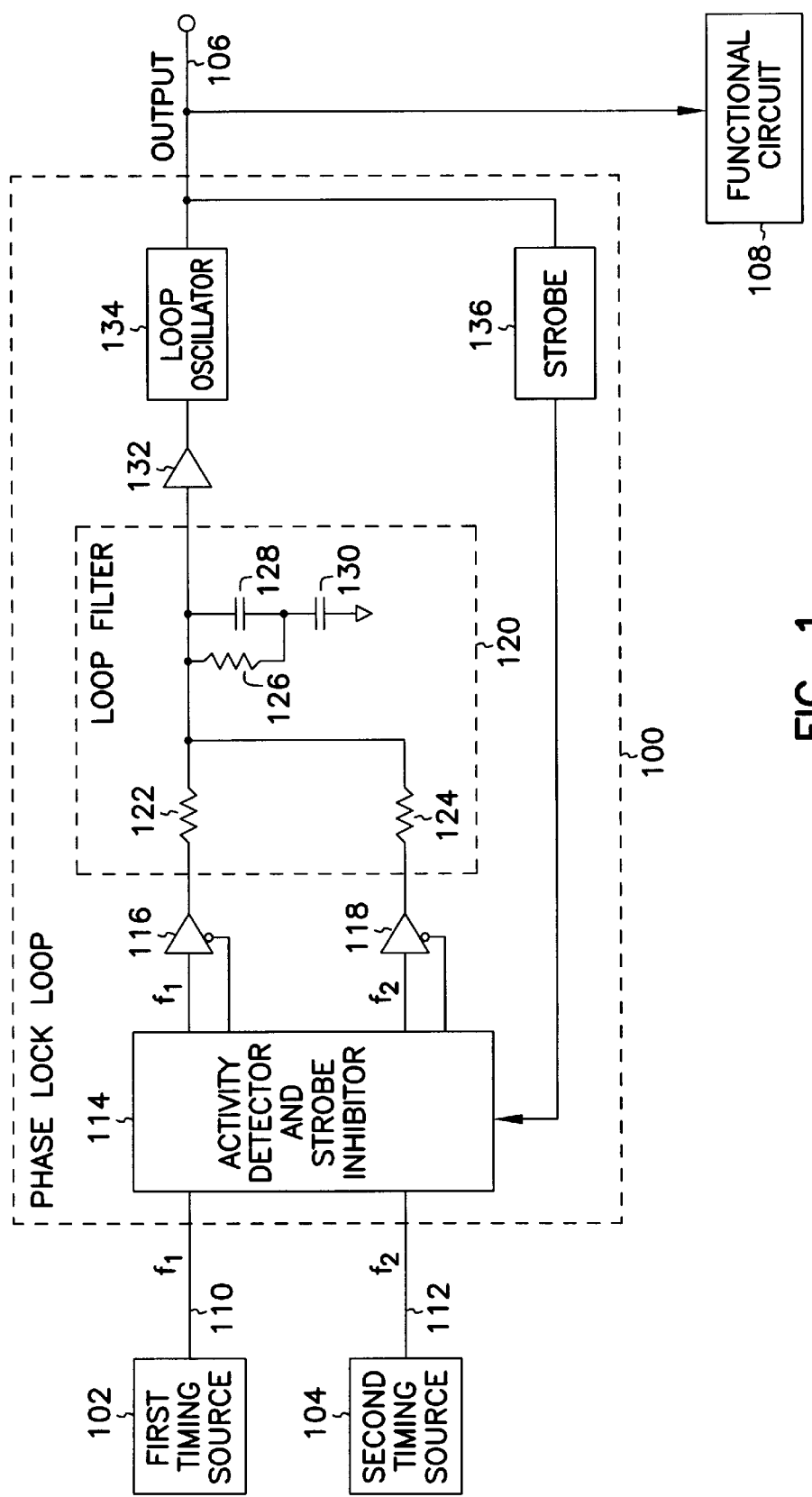
FIG. 1 is a block diagram of an illustrative embodiment of a phase average phase lock loop that is constructed according to the teachings of the present invention.

FIG. 1 is a block diagram of an illustrative embodiment of a phase average phase lock loop, indicated generally at 100, that is constructed according to the teachings of the present invention. Phase lock loop 100 receives reference signals from first and second timing sources 102 and 104, respectively. Phase lock loop 100 produces an output signal at output 106 such that the output signal has a phase that is between the phase of the reference signals from first and second timing sources 102 and 104. The output signal of phase lock loop 100 is provided to functional circuit 108.

In one embodiment, functional circuit 108 and phase lock loop 100 are included in a module in a telecommunications device such as an add/drop multiplexer or a clocked data source for an optical transmitter. First and second timing sources 102 and 104 may comprise, for example, working and protection clocks that produce synchronous timing signals in accordance with the synchronous optical network (SONET) standard. The timing sources are disposed in a rack for the telecommunications device. The reference signals are provided to phase lock loop 100 over first and second busses 110 and 112, respectively.

Phase lock loop 100 aligns the phase of its output signal at a point between the phase of reference signals from first and second timing sources 102 and 104 rather than aligning the phase of its output signal with one of the two reference signals. When one of the timing sources fails or is otherwise removed from the system, phase lock loop 100 moves the phase of its output to align with the phase of the reference signal from the remaining timing source. Thus, phase lock loop 100 provides the advantage of reducing the phase transient when one of the timing sources fails. In such a case, the phase transient is approximately half the phase difference between the two reference signals rather than the entire phase difference. With this performance advantage, phase lock loop 100 provides the capability of performing a "hitless switch" in a telecommunication system using SONET timing such that data is not lost when one timing source fails or is removed from the system.

Phase lock loop 100 includes circuitry that detects phase differences between the reference signals from first and second timing sources 102 and 104. Phase lock loop 100 includes activity detector and strobe inhibitor (detector) 114. Detector 114 is coupled to receive the reference signals from first and second timing sources 102 and 104. Detector 114 detects a loss of activity from the timing sources. When a reference signal is inactive or absent, detector 114 inhibits the strobe signal that is provided to the associated pass gate 116 or 118. This prevents the reference signal from being considered by phase lock loop 100 so that the output of phase lock loop 100 aligns with the remaining reference signal.

Detector 114 is coupled to provide reference signals, $f_1$ and $f_2$ to pass gates 116 and 118, respectively. Further, detector 114 also provides strobe signals from strobe 136 to enable inputs of both pass gate 116 and pass gate 118. It is noted that the strobe signal for each pass gate is derived from the same strobe such that the strobe does not introduce phase error into the operation of phase lock loop 100.

Pass gates 116 and 118 are coupled to loop filter 120. Loop filter 120 comprises, for example, resistors 122, 124 and 126 and capacitors 128 and 130. In this configuration, loop filter 120 is a second order filter. In other embodiments, a first order filter can be substituted. Loop filter 120 should have a width that is at least equal to the maximum expected frequency error between the loop oscillator and the reference clock when out of lock. It is noted that other filters can be used in place of the configuration shown in FIG. 1. Essentially, loop filter 120 averages the value of the reference signals during a measurement window established by strobe 136. The output of this averaging operation is a measurement of the phase difference between loop oscillator 134 and the average phase of the two reference signals.

The output of loop filter 120 is used as an input to loop oscillator 134 through amplifier 132. Loop oscillator 134 comprises, for example, a voltage controlled crystal oscillator, (VCXO). Other appropriate circuits can be used to generate the output of loop oscillator 134. The output of loop filter 120 provides the control signal that sets the frequency and phase of the output from loop oscillator 134. For example, in a five volt system, loop filter 120 provides a signal that is approximately 2.5 volts (the midpoint of the voltage range for input to the VCXO circuit) such that the loop oscillator provides an output signal with a phase that is approximately half-way between the first and second reference signals.

The output of loop oscillator 134 also is coupled to strobe 136. Strobe 136 creates a strobe signal with a width that is approximately twenty percent of the period of one of the reference signals plus a period of time selected to allow for expected phase differences between the two reference signals. In other words, the width of the strobe should be set to accommodate the maximum expected difference between the phases of the two reference signals. A single strobe circuit is used so as to produce substantially equal loop gain for each reference signal.

Advantageously, the embodiments of the present invention described herein provide reduced phase noise in the loop oscillator output by use of the described direct sampling phase detector.

Figure 2:
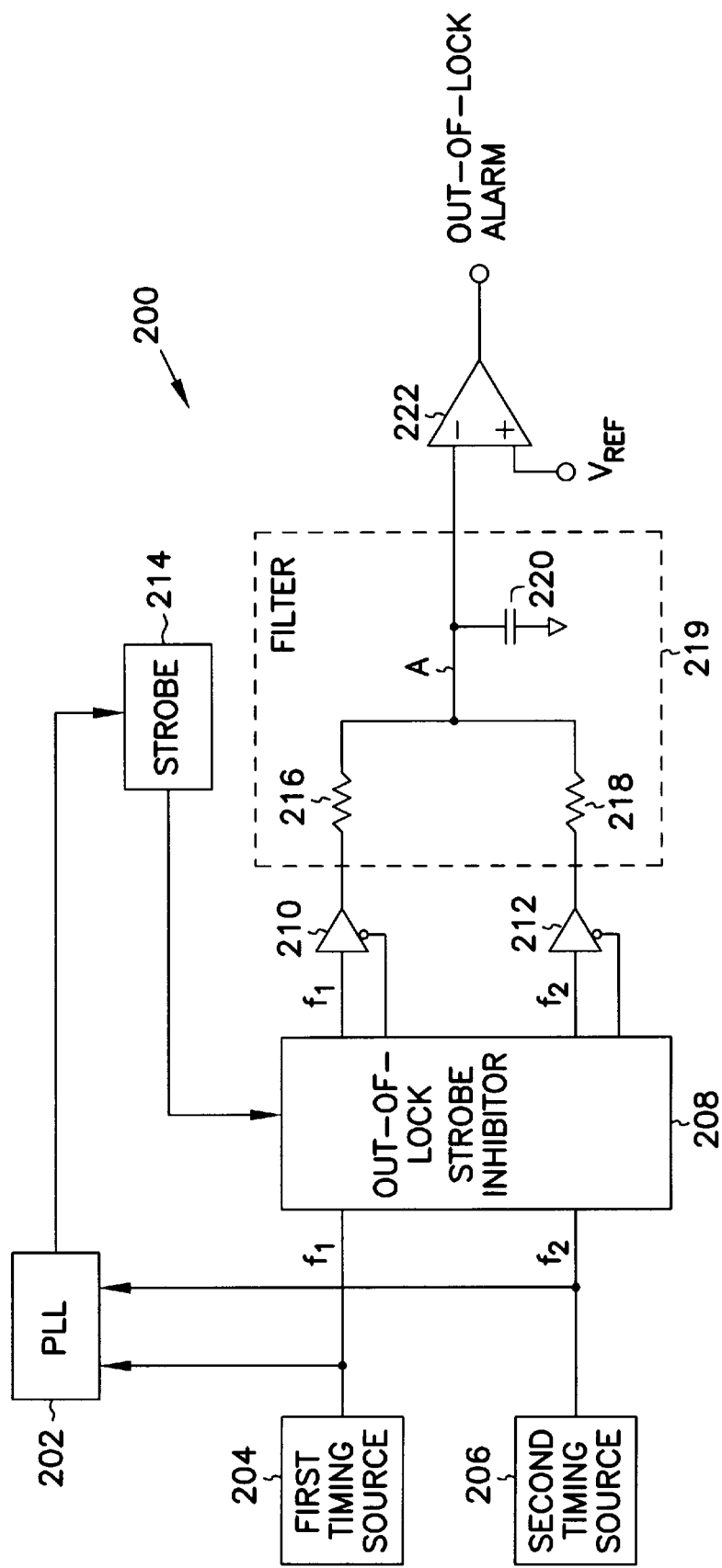
FIG. 2 is a block diagram of an illustrative embodiment of an out-of-lock alarm for a phase average phase lock loop according to the teachings of the present invention.
Figure 3A:
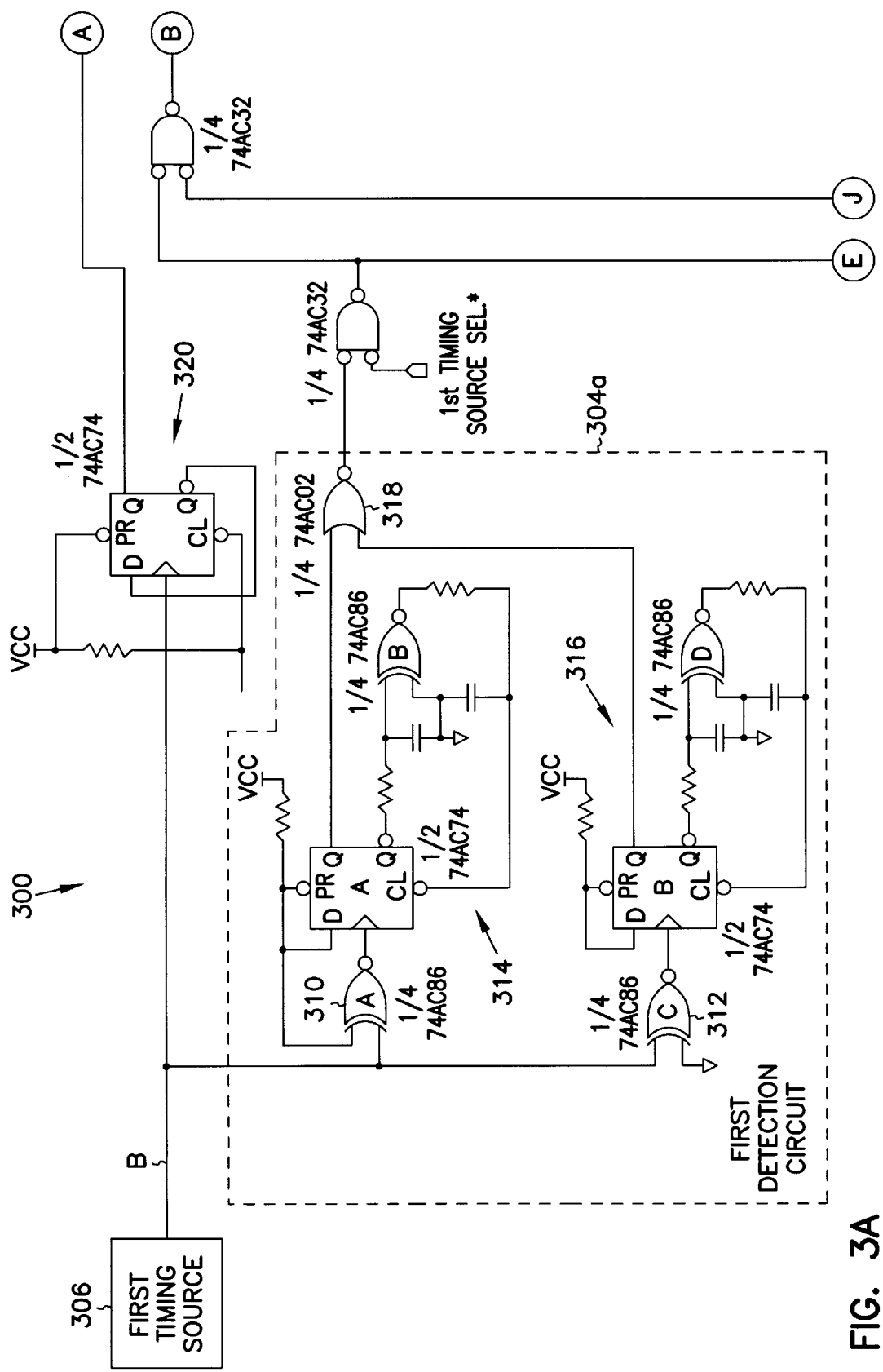
FIGS. 3A, 3B, 3C, and 3D are schematic diagrams of an illustrative embodiment of a phase lock loop with an out-of-lock alarm that is constructed according to the teachings of the present invention.
Figure 3B:
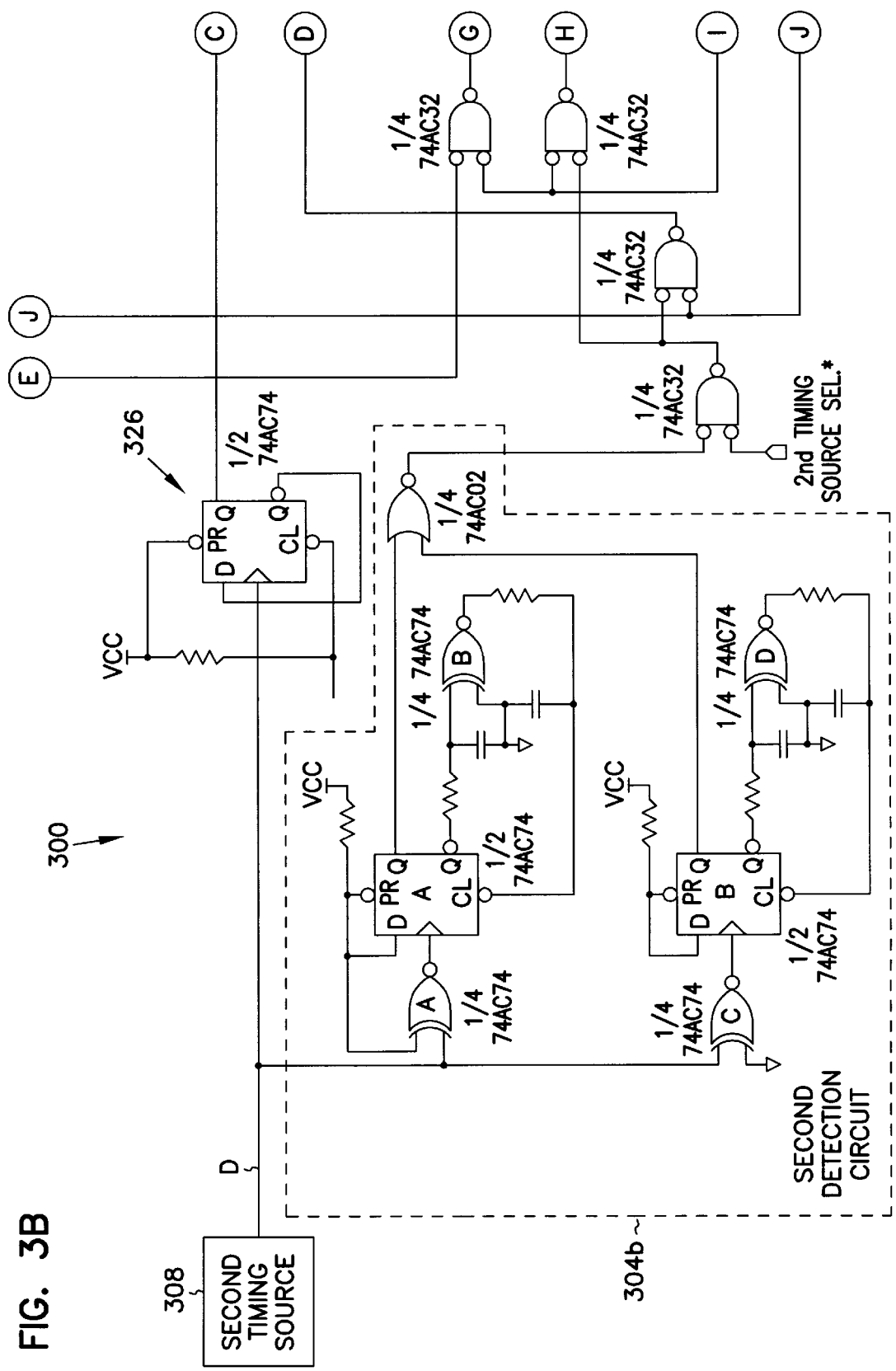
Figure 3C:
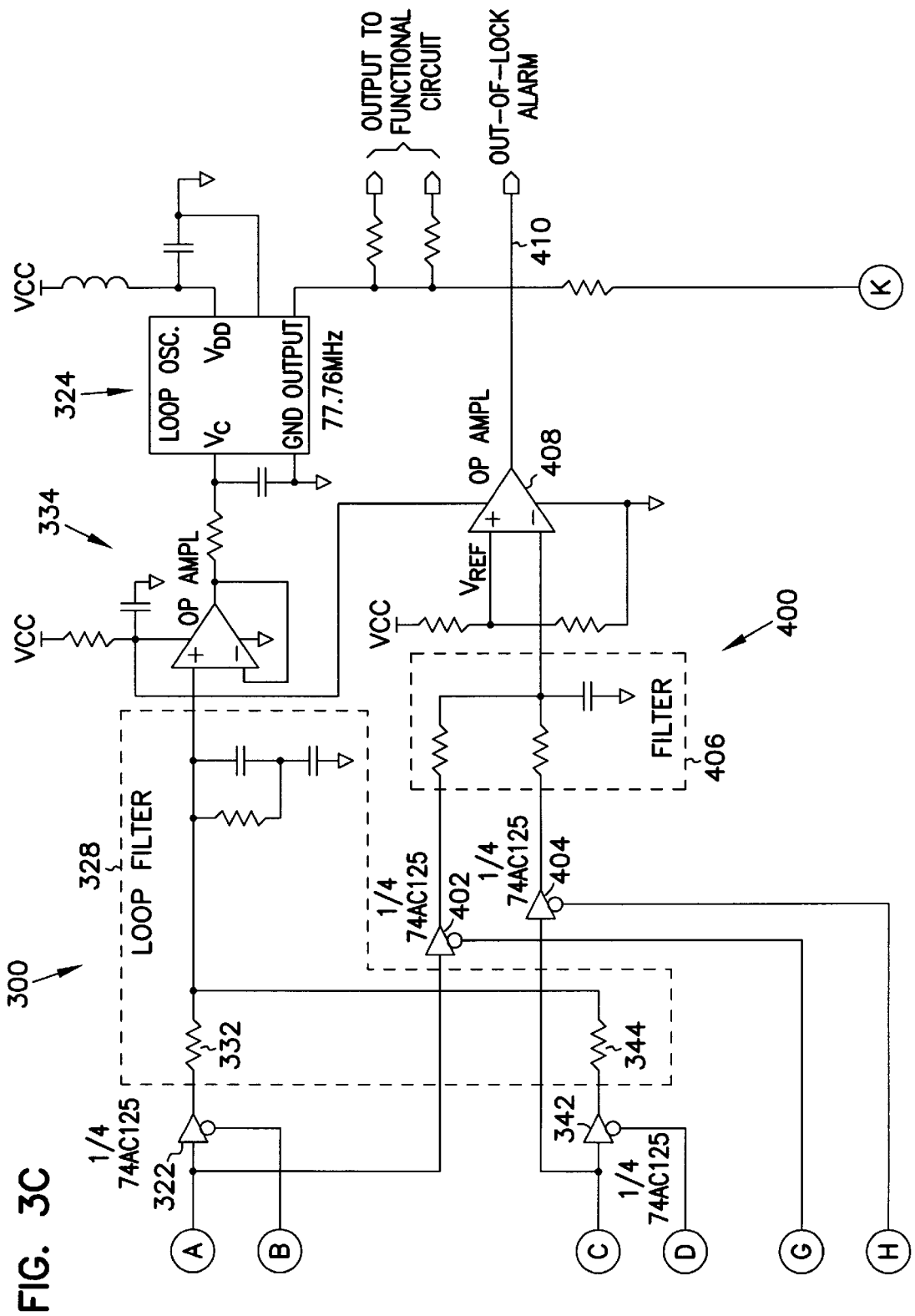
Figure 3D:
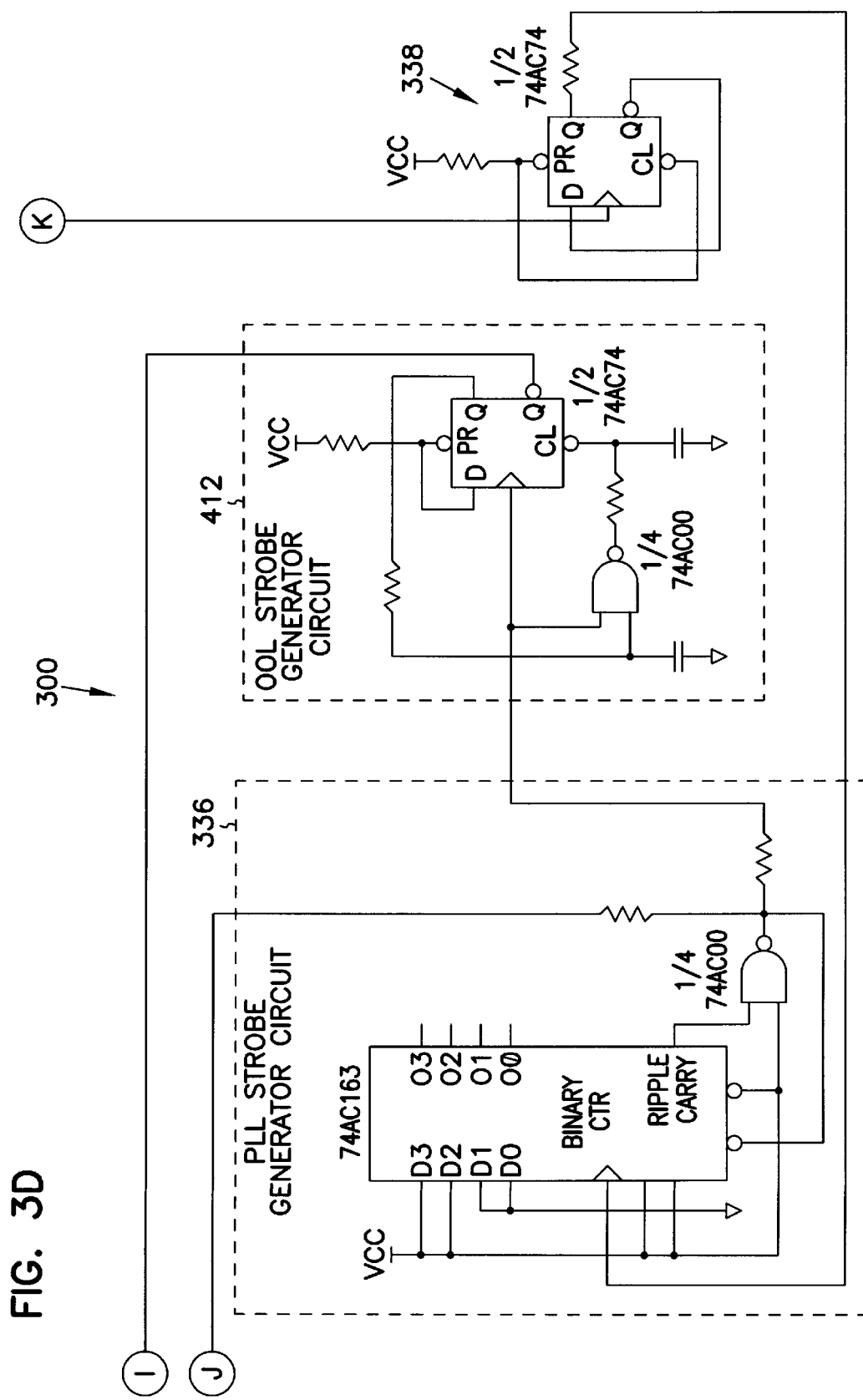

FIG. 2 is a block diagram of an illustrative embodiment of an out-of-lock alarm, indicated generally at 200, for phase average phase lock loop 202 according to the teachings of the present invention. Alarm 200 and phase lock loop 202 receive reference signals from first and second timing sources 204 and 206. In one embodiment, phase lock loop 202 is constructed as shown and described above with respect to phase lock loop 100 of FIG. 1.

Alarm 200 includes out-of-lock strobe inhibitor 208. Inhibitor 208 is coupled to receive the reference signals from first and second timing sources 204 and 206. Further, inhibitor 208 receives a strobe signal from strobe 214. Strobe 214 is driven by the output of phase lock loop 202. In one embodiment, strobe 214 has a width that is approximately 10 percent of the period of the reference signals. Further, strobe 214 begins to strobe the reference signals at the end of a strobe in phase lock loop 202, more specifically, at the end of strobe 136 of FIG. 1.

Alarm 200 further includes first and second pass gates 210 and 212. Inhibitor 208 provides reference signals, $f_1$ and $f_2$ to pass gates 210 and 212, respectively. Further, inhibitor 208 also provides strobe signals from strobe 214 to enable inputs of both pass gate 210 and pass gate 212. When loss of signal is detected for one of the timing sources, inhibitor 208 inhibits the strobe signal from being applied to the enable input of the pass gate which has lost an input reference signal, so that alarm 200 will not indicate an out-of-lock condition. When both of the timing sources are present, inhibitor 208 provides the strobe signal to pass gates 210 and 212 so that alarm 200 can determine whether the reference signals are out-of-lock.

Pass gates 210 and 212 are coupled to filter 219. In alarm 200, filter 219 may comprise a simple, first order, R-C filter. For example, as shown, filter 219 includes capacitor 220 that is coupled through resistors 216 and 218, respectively, to the output of pass gates 210 and 212 at common node A. Capacitor 220 is coupled between node A and ground potential. Essentially, filter 219 indicates that the voltage of the first and second reference signals is high during strobe 214 when phase lock loop 202 is in lock.

Alarm 200 further includes comparator 222. Comparator 222 includes first and second inputs. The first input is coupled to node A and the second input is coupled to a reference voltage. Comparator 222 compares the voltage at node A with a reference voltage to determine when the reference signals are out-of-lock. Node A is near the positive supply rail when locked and approximately one-half supply rail voltage when out-of-lock.

FIGS. 3A, 3B, 3C, and 3D are schematic diagrams of another illustrative embodiment of a phase lock loop with an out-of-lock alarm that is constructed according to the teachings of the present invention. Phase lock loop 100 generates an output signal that has a phase that is between the phase of signals received from first and second timing sources 306 and 308. First timing source 306 is coupled to provide a timing signal to phase lock loop 300 at node B and second timing source 308 provides a timing signal to phase lock loop 300 at node D. Phase lock loop 300 uses the signals from first and second timing sources 306 and 308 to produce a control signal to lock the output of loop oscillator 324 at a phase that is between the phases of the timing signals from first and second timing sources 306 and 308. In this embodiment, loop oscillator 324 comprises a Voltage Controlled Crystal Oscillator (VCXO) operating at 77.76 MHZ, which has increasing output frequency as control voltage at VC becomes more positive. In other embodiments, other oscillators with adjustable output frequencies can be used.

Loop filter 328 creates a signal, based on the relative phases of the signals from loop oscillator 324 and the average phase of first and second timing sources 306 and 308. In this embodiment, loop filter 328 comprises a second order R-C circuit. It is understood that other circuits, including first and second order filters can be used in place of the illustrated embodiment. Initially, the signal from first timing source 306 is coupled to divide-by-two flip-flop circuit 320. Flip-flop 320 assures that the signal applied to loop filter 328 has a 50—50 duty cycle. The output of flip-flop 320 is coupled to an input of pass gate 322. Pass gate 322 is controlled by strobe circuit 336 to sample the timing signal from first timing source 306. This sampled output of pass gate 322 is coupled to loop filter 328 through resistor 332. The output of loop filter 328 is coupled through amplifier circuit 334 to the VC input of loop oscillator circuit 324. This output of loop filter 328 represents the phase difference between the average phase of the first and second timing sources 306 and 308, and loop oscillator 324.

The output of loop oscillator 324 is used to create the strobe signal that is coupled to the enable input of pass gate 322. The output of loop oscillator 324 is coupled through divide-by-two flip-flop 338 to phase lock loop (PLL) strobe generator circuit 336. In one embodiment, strobe generator circuit 336 comprises a synchronous presettable binary counter that is configured so as to produce a strobe signal with a width that is approximately twenty percent of the period of one of the timing signals plus a period of time selected to allow for expected phase differences, e.g., the maximum expected difference, between the two timing signals.

Strobe generator circuit 336 is coupled through logic gates to the enable input of pass gate 322. The logic gates disconnect one of the timing signals from loop filter 328 when loss of activity of that signal is detected by the associated detection circuits 304a and 304b.

Phase lock loop 300 includes a similar path that processes the timing signal from second timing source 308. At node D, the timing signal is applied to divide-by-two flip-flop circuit 326 so as to assure that the signal has a 50—50 duty cycle. The output of flip-flop circuit 326 is applied to pass gate 342. At power-up, flip-flops 320 and 326 are forced in-phase so as to preclude a 180 degree ambiguity between first and second timing sources. The output of pass gate 342 is applied, through resistor 344, to loop filter 328 where it is combined and processed with the timing signal from first timing source 306. The signal from strobe generation circuit 336 is coupled to an enable input of pass gate 342. The strobe signal from this single source is used to sample both of the timing signals over the same time window. The loop filter essentially averages the timing signals over this window. The output is a number that is used to adjust loop oscillator 324 so as to place the phase of the output signal between the phase of the timing signals from first and second timing sources 306 and 308.

In some circumstances, one of the timing sources may not be active. Phase lock loop 300 is designed to detect when one of the timing sources is not active. In such a case, phase lock loop 300 adjusts to align the phase of the signal output by oscillator 324 to match the phase of the timing signal from the remaining timing source.

First detection circuit 304a detects a loss of activity from first timing source 306. This allows the phase lock loop to align with a signal from second timing source 308 when the signal from first timing source 306 is not present in the same manner as described above with respect to FIG. 1. Second detection circuit 304b similarly detects loss of activity from second timing source 308. Due to the similarity of the two detection circuits, only first detection circuit 304a is described in more detail below. However, it is understood that second detection circuit 304b is constructed and operates in a similar manner.

First detection circuit 304a includes first and second exclusive OR gates 310 and 312 that have an input that is coupled to node B. A second input of exclusive OR gate 310 is coupled to a high logic level and a second input of exclusive OR gate 312 is coupled to a low logic level. An output of exclusive OR gates 310 and 312 are coupled to clock inputs of first and second flip-flop circuits 314 and 316, respectively. First flip-flop circuit 314 is configured so as to output a high logic level when the signal from first timing source 306 transitions to a high logic level. Similarly, second flip-flop circuit 316 is configured such that it outputs a high logic level when the signal from first timing source 306 transitions to a low logic level.

The outputs of first and second flip-flop circuits 314 and 316 are coupled to the inputs of NOR gate 318. NOR gate 318 provides a low logic level output only when either of first and second flip-flop circuits 314 and 316 produce a high logic level. These high logic levels are only produced by first and second flip-flop circuits 314 and 316 when the signal from first timing source 306 is active. Otherwise, when the signal is lost, first and second flip-flop circuits 314 and 316 produce low logic levels and thus NOR gate 318 produces a high logic level. This indicates that there is no active signal being applied from first timing source 306 and the high logic level inhibits the strobe of the inactive timing source. Second detection circuit 304b operates in a similar manner.

In operation, phase lock loop 300 locks the phase of the output of loop oscillator between the phase of the timing signals from first and second timing sources 306 and 308. The timing signals from first and second timing sources 306 and 308 are sampled by pass gates 322 and 342, respectively. The sampling is controlled by strobe circuit 336. Loop filter 328 generates a signal, based on the sampled timing signals, that sets the phase of oscillator 324 to be between the phase of the two timing signals.

Phase lock loop 300 further includes out-of-lock alarm circuit 400. Alarm 400 includes pass gates 402 and 404. The outputs of pass gates 402 and 404 are coupled to filter 406. The output of filter 406 is coupled to a first input of comparator 408. A second input of comparator 408 is coupled to a reference voltage, $V_{REF}$. Comparator 408 produces an out-of-lock alarm signal at 410 when loop 300 is out-of-lock.

Pass gates 402 and 404 of alarm 400 include enable inputs that are coupled, through logic gates, to a second strobe signal. The logic gates allow the strobe signal to be inhibited when a loss of activity is detected on one of the timing signals from first and second timing sources 306 and 308. The strobe signal for pass gates 402 and 404 is generated by out-of-lock (OOL) strobe generation circuit 412. OOL strobe generation circuit 412 input is coupled to the output of PLL strobe generation circuit 336. OOL strobe generation circuit is coupled through logic gates to the enable inputs of pass gates 402 and 404. OOL strobe generation circuit 412 is configured so as to produce a strobe signal with a width that is approximately 10 percent of the period of the timing signals. Further, OOL strobe generation circuit 412 begins to strobe the timing signals at the end of a strobe signal of PLL strobe generation circuit 336, at such time as both timing source signals are logic high when the loop is in lock.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the width of the strobe signals can be varied from the widths identified above. Further, the filter used to drive the loop oscillator can similarly be altered without departing from the spirit and scope of the present invention. In another embodiment, all logic functions except the sample gates and the divide-by-two clocked by the loop oscillator may be programmed in a Complex Programmable Logic Device (CPLD). The functions of first and second detection circuits 304a and 304b are performed by over-sampling the timing sources to verify continuous transitions of the timing sources. Further, the loop oscillator can generate a signal with a frequency that is appropriate for the particular functional circuit and reference timing sources that use the phase lock loop.

What is claimed is:

1. A phase lock loop circuit, comprising:
   first and second pass gates with signal inputs that receive first and second reference signals, respectively, and with enable inputs;
   a loop filter that is coupled to the outputs of the first and second pass gates;
   a loop oscillator that is coupled to the output of the loop filter;
   a strobe circuit that is coupled to the output of the loop oscillator and that provides an input signal to the enable inputs of the first and second pass gates so as to sample the first and second reference signals; and
   wherein, when the first and second reference signals are both present, the loop filter uses the samples of the first and second reference signals simultaneously to create a control signal that forces the loop oscillator to output a signal with a phase that is set relative to the average of the phases of the first and second reference signals.

2. The circuit of claim 1, wherein the loop oscillator comprises a voltage controlled oscillator.

3. The circuit of claim 1, wherein the loop oscillator comprises a voltage controlled crystal oscillator.

4. The circuit of claim 1, wherein the strobe circuit has a measurement window with a width that is approximately twenty percent of the period of one of the reference signals plus a period of time selected to allow for expected phase differences between the two reference signals.

5. The circuit of claim 1, wherein the loop filter comprises:
   first and second input resistors;
   first and second capacitors;
   a third resistor; and
   wherein the first capacitor and the third resistor are coupled in parallel and one node of the first capacitor is coupled to the output of the pass gates through the first and second input resistors and the second capacitor is coupled between a second node of the first capacitor and ground potential.

6. The circuit of claim 1, wherein the loop filter comprises a resistor-capacitor (RC) circuit.

7. The circuit of claim 1, wherein the loop filter comprises a first order filter.

8. The circuit of claim 1, and further comprising an activity detector that detects the presence and absence of the reference signals such that the output of the loop oscillator aligns with the phase of the remaining reference signal when one of the reference signals is absent.

9. An apparatus, comprising:
   a functional circuit;
   first and second inputs that receive timing signals from first and second timing sources;
   a phase lock loop, including:
     a loop oscillator that produces an output signal with a phase that is set relative to the average of the phases of the timing signals for the first and second sources,
     a single strobe circuit, coupled to the output of the loop oscillator, that samples the the timing signals from the first and second timing source, and
     a loop filter that receives the samples of the timing signals from both the first and second timing sources simultaneously when present, and that generates a control signal that controls the output of the loop oscillator; and
   wherein the output signal of the loop oscillator is provided as a timing signal to the functional circuit.

10. The apparatus of claim 9, wherein the functional circuit comprises an add/drop multiplexer in a telecommunications system.

11. The apparatus of claim 9, wherein the functional circuit comprises a clocked data source for an optical transmitter.

12. The apparatus of claim 9, wherein the first and second timing sources comprise SONET timing sources.

13. The apparatus of claim 9, wherein the phase lock loop comprises:
   first and second pass gates with signal inputs that receive the first and second timing signals, respectively, and with enable inputs;

wherein the loop filter is coupled to the outputs of the first and second pass gates;

wherein the strobe circuit provides an input signal to the enable inputs of the first and second pass gates so as to sample the first and second timing signals.

14. The apparatus of claim 9, and further comprising an out-of-lock alarm, the alarm comprising:

first and second pass gates that have inputs coupled to the first and second timing signals and that have enable inputs;

a strobe that is coupled to an output of the strobe circuit of the phase lock loop and that is coupled to the enable inputs of the first and second pass gates;

a filter that is coupled to the outputs of the first and second pass gates; and a comparator that is coupled to the output of the filter that compares the output of the filter with a reference level to determine when to set an out-of-lock alarm.

15. The apparatus of claim 9, and further comprising an activity detector that detects the presence and absence of the timing signals such that the output of the loop oscillator aligns with the phase of the remaining timing signal when one of the timing signals is absent.

16. An apparatus, comprising:

first and second timing sources that produce first and second timing signals;

a functional circuit;

first and second inputs that receive the first and second timing signals;

and a phase lock loop, including:

a loop oscillator that produces an output signal with a phase that is set relative to the average of the phases of the first and second timing signals, a single strobe circuit, coupled to the output of the loop oscillator, that samples the the first and second timing signals, and a loop filter that receives the samples of the first and second timing signals from both of the first and second timing sources simultaneously when present, and that generates a control signal that controls the output of the loop oscillator; and wherein the output signal of the loop oscillator is provided as a timing signal to the functional circuit.

17. The apparatus of claim 16, wherein the functional circuit comprises an add/drop multiplexer in a telecommunications system.

18. The apparatus of claim 16, wherein the functional circuit comprises a clocked data source for an optical transmitter.

19. The apparatus of claim 16, wherein the first and second timing sources comprise SONET timing sources.

20. The apparatus of claim 16, wherein the phase lock loop comprises:

first and second pass gates with signal inputs that receive the first and second timing signals, respectively, and with enable inputs;

wherein the loop filter is coupled to the outputs of the first and second pass gates;

wherein the strobe circuit provides an input signal to the enable inputs of the first and second pass gates so as to sample the first and second timing signals.

21. The apparatus of claim 16, and further comprising an out-of-lock alarm, the alarm comprising:

first and second pass gates that have inputs coupled to the first and second timing signals and that have enable inputs;

a strobe that is coupled to an output of the strobe circuit of the phase lock loop and that is coupled to the enable inputs of the first and second pass gates;

a filter that is coupled to the outputs of the first and second pass gates; and a comparator that is coupled to the output of the filter that compares the output of the filter with a reference level to determine when to set an out-of-lock alarm.

22. The apparatus of claim 16, and further comprising an activity detector that detects the presence and absence of the timing signals such that the output of the loop oscillator aligns with the phase of the remaining timing signal when one of the timing signals is absent.

23. A method for establishing a timing signal for a functional circuit from first and second reference signals, the method comprising:

driving a strobe circuit with the output of a loop oscillator;

sampling the first and second reference signals simultaneously when present, using an output of the strobe;

generating a control signal for the loop oscillator based on the sampled first and second reference signals so as to set the phase of the loop oscillator relative to the average of the phases of the first and second reference signals.

* * * * *